(12) United States Patent
Haskett

(10) Patent No.: US 8,138,588 B2
(45) Date of Patent: Mar. 20, 2012

(54) PACKAGE STIFFENER AND A PACKAGED DEVICE USING THE SAME

(75) Inventor: Bradley Morgan Haskett, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 480 days.

(21) Appl. No.: 11/614,704

(22) Filed: Dec. 21, 2006

(65) Prior Publication Data

US 2008/0151353 A1 Jun. 26, 2008

(51) Int. Cl.
*G02B 26/00* (2006.01)

(52) U.S. Cl. .......... 257/678; 359/291; 348/E5.142

(58) Field of Classification Search .......... 257/678; 359/291; 348/E5.142
See application file for complete search history.

(56) References Cited

U.S. PATENT DOCUMENTS

| | | | |
|---|---|---|---|
| 6,624,003 B1 * | 9/2003 | Rice | 438/106 |
| 6,624,921 B1 | 9/2003 | Glenn et al. | |
| 6,844,959 B2 | 1/2005 | Huibers et al. | |
| 6,917,525 B2 * | 7/2005 | Mok et al. | 361/767 |
| 6,921,868 B2 * | 7/2005 | Salmela et al. | 174/255 |
| 6,962,419 B2 | 11/2005 | Huibers | |
| 6,969,635 B2 | 11/2005 | Patel | |
| 7,034,985 B1 | 4/2006 | Huibers | |
| 7,042,623 B1 | 5/2006 | Huibers | |
| 7,105,861 B2 * | 9/2006 | Erchak et al. | 257/99 |
| 7,164,199 B2 | 1/2007 | Tarn | |
| 7,202,552 B2 * | 4/2007 | Zhe et al. | 257/659 |
| 7,259,106 B2 * | 8/2007 | Jain | 438/737 |
| 7,349,233 B2 * | 3/2008 | Bains et al. | 365/63 |
| 7,365,683 B2 * | 4/2008 | Park | 343/700 MS |
| 7,450,296 B2 * | 11/2008 | Jang et al. | 359/290 |
| 7,455,667 B2 * | 11/2008 | Uhland et al. | 604/890.1 |
| 7,683,477 B2 * | 3/2010 | Otremba | 257/723 |
| 2004/0046248 A1 * | 3/2004 | Waelti et al. | 257/712 |
| 2005/0157374 A1 * | 7/2005 | Tarn | 359/291 |
| 2005/0275075 A1 * | 12/2005 | Hong et al. | 257/678 |
| 2006/0131601 A1 * | 6/2006 | Ouderkirk et al. | 257/99 |
| 2006/0139713 A1 * | 6/2006 | Yee et al. | 359/201 |
| 2006/0197215 A1 * | 9/2006 | Potter | 257/704 |
| 2006/0281227 A1 * | 12/2006 | Yang | 438/118 |
| 2007/0080360 A1 * | 4/2007 | Mirsky et al. | 257/99 |
| 2007/0254490 A1 * | 11/2007 | Jain | 438/736 |
| 2008/0055703 A1 * | 3/2008 | Pan | 359/290 |
| 2008/0121343 A1 * | 5/2008 | Cohen et al. | 156/344 |
| 2008/0131658 A1 * | 6/2008 | Wakharkar et al. | 428/137 |
| 2008/0150065 A1 * | 6/2008 | Oda | 257/434 |
| 2008/0158892 A1 * | 7/2008 | Davis | 362/362 |
| 2008/0178463 A1 * | 7/2008 | Okubora | 29/830 |
| 2008/0179696 A1 * | 7/2008 | Chen et al. | 257/415 |
| 2009/0098685 A1 * | 4/2009 | Duboc et al. | 438/116 |
| 2009/0256882 A1 * | 10/2009 | Chen et al. | 347/20 |

* cited by examiner

*Primary Examiner* — Alexander O. Williams
(74) *Attorney, Agent, or Firm* — Charles A. Brill; Warren L. Franz; Frederick J. Telecky, Jr.

(57) ABSTRACT

A package frame for use in packaging microelectromechanical devices and/or spatial light modulators comprises a frame, a stiffener, and a heat dissipater.

16 Claims, 3 Drawing Sheets

PACKAGE STIFFENER AND A PACKAGED DEVICE USING THE SAME

TECHNICAL FIELD

The technical field of the examples to be disclosed in the following sections is generally related to the art of packages for spatial light modulator devices, and more particularly, to packages for optoelectronic devices and packaged optoelectronic devices using the same.

BACKGROUND

Engineers involved in packaging microelectromechanical (MEMS) devices, such as optoelectronic devices (e.g. digital micromirror display DMD by Texas Instruments), are confronted with a complex set of requirements, including issues such as accurate mechanical alignment features, rigid structure that does not deflect or deform significantly under system loads, thermal management that includes coefficient of thermal expansion (CTE) matching and heat dissipation from the packaged device, reliability, and others. All these issues can be translated into materials and designs for the package. Even with all of the above requirements satisfied, successful commercialization of microelectromechanical devices, however, is still limited by one factor—cost efficiency of current packages and associated packaging processes.

In traditional integrated circuit fabrication, packaging contributes approximately ⅓ of the manufacturing cost. MEMS packaging, depending upon the desired use, can have a number of desired qualities, which can be more demanding than the traditional integrated circuit packaging due to the fragile microstructures of the MEMS devices, and is often considered a significantly expensive portion in MEMS manufacturing and packaged MEMS devices.

SUMMARY

In one example, a device is disclosed herein. The device comprises: a light transmissive substrate having a portion that is transmissive to visible light; a semiconductor substrate having a top surface bonded to the light transmissive substrate and a bottom surface resting on a supporting surface of a package; and wherein the package is composed of a polymeric material.

In another example, a packaged device is provided herein. The device comprises: a package substrate comprising a polymeric material; a stiffening substrate in or on the package substrate for improving stiffness of the package; and a microelectromechanical device disposed on the package substrate.

In yet another example, a packaged device is disclosed herein. The device comprises: a package substrate comprising a first material; a stiffening substrate comprising a second material for improving the stiffness of the package substrate, wherein the second material is more stiff than the first material; wherein the stiffener is in or on the package substrate; and a spatial light modulator disposed on the package substrate.

In still yet another example, a packaged device is disclosed herein. The device comprises: a package substrate comprising a first material; a stiffening substrate comprising a second material for improving the stiffness of the package substrate, wherein the second material is more stiff than the first material, wherein the stiffener is in or on the package substrate; and a MEMS disposed on the package substrate.

In yet another example, a packaged device is disclosed herein. The device comprises: a plastic package substrate; a stiffening substrate embedded in the plastic package substrate for improving stiffness of the plastic package; and a spatial light modulator bonded to the plastic package substrate.

DETAILED DESCRIPTION OF SELECTED EXAMPLES

Disclosed herein is a package for packaging MEMS devices at low cost. The package incorporates capabilities comprising accurate mechanical alignment, rigid structure, a flat and CTE-matched surface for device mounting, and heat dissipation.

Figure 1:
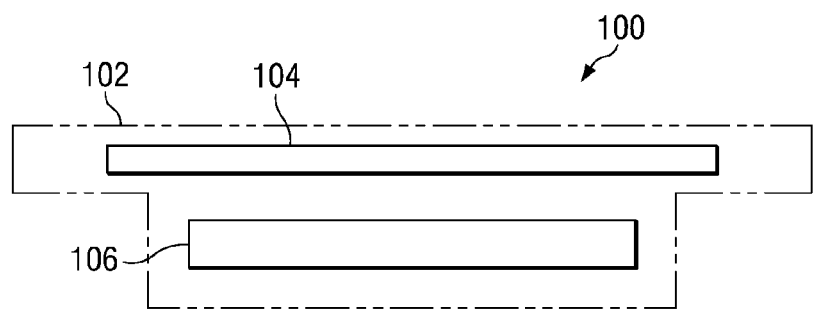
FIG. 1 illustrates a side view of a package.

Turning to the drawings, FIG. 1 illustrates a side view of an exemplary package. In this example, package 100 comprises package substrate 102, stiffener 104, and heat dissipater 106. Other features, such as getter and lubricant materials can also be attached to the package, which are not shown in the figure for simplicity purpose.

Package substrate 102 can be molded to have a cavity in which heat dissipater 106 can be disposed. In an alternative example, package substrate 102 can be a substantially flat substrate without cavities. Though not required, package substrate 102 can be composed of a polymeric organic material, such as a thermoplastic polyester, and more preferably a liquid-crystal polymer (LCP) of the thermoplastic polyester family. The family of thermoplastic polyesters is a class of materials known as liquid crystal polymers (LCPs), aromatic copolyesters with a tightly ordered structure that is self-reinforcing. Liquid crystal polymers are highly crystalline, thermotropic (melt-orienting) thermoplastics that can deliver exceptionally precise and stable dimensions, high temperature performance and chemical resistance. For illustration purposes, package substrate 102 is shown in the figure as transparent such that other features are visible. Though an organic polymer is preferred for package substrate 102, hybrid organic materials or fully inorganic materials are also applicable. For example, package substrate 102 can comprise a thermoplastic polymeric material with linear or branched chains, thermosets with crosslinked chains, elastomers, or coordination polymers.

Stiffener 104 is provided for enhancing the mechanical properties of package 100. For this reason, the stiffener is preferably composed of a material of high stiffness, such as metallic and metalloid materials. In one example, the stiffener can be a stamped metal, such as steel. Other materials, such as oxides, nitride, and carbides of metals, metalloids, metal alloys, and other materials, are also applicable. The stiffener can take any desired forms. As one example, stiffener 104 can be a flat ring as shown in the top view in FIG. 2. Alternatively, the stiffener can be segments, bars, and many other geometric shapes. The stiffener can be inserted into the body of package substrate 102 such that substantially no major surfaces of the stiffener are exposed, as illustrated in FIG. 1. In another example, the stiffener can be embedded into a major surface (e.g. the top or bottom surface) of package substrate 102 such that at least a major surface of the stiffener is exposed. The later example may be of particular importance for hermetic bonding when a metallic sealing material is to be used for bonding package substrate 102 to a package cover. In this instance, the exposed metallic surface of the stiffener can be used to enhance adhesion of the bonding material to package substrate 102; and a metallization material for bonding may not be necessary.

Heat dissipater 106 is disposed on a supporting surface of package substrate 102. In the example as shown in the figure wherein package substrate has a cavity, the supporting surface can be the top surface of the cavity and the heat dissipater can be disposed thereon. The heat dissipater provides a heat dissipation path for spreading and dissipating heat away from the device that is disposed on the heat dissipater for being packaged. To improve heat dissipation efficiency, the surface on which the device is to be placed can be substantially flat. Moreover, the CTE of the heat dissipation preferably matches the CTE of the substrate of the device that is in direct contact with the heat dissipater.

The heat-dissipation efficiency can be further improved by placing a compliant thermo-conductive material on the top surface of the heat dissipater so as to increase the contact area of the device being packaged and the heat dissipater. The compliant thermo-conductive material can be selected from a variety of suitable materials, but is more preferably a material whose CTE matches either the device substrate or the heat dissipater or both. When the CTEs of the device substrate and the heat dissipater are different, the CTE of the compliant thermo-conductive material (if provided) is preferably between the two different CTEs of the device substrate. The heat dissipater can be composed of any suitable thermally conductive materials, such as metallic and metalloid materials (e.g. Kovar) and ceramic (e.g. alumina).

Figure 2:
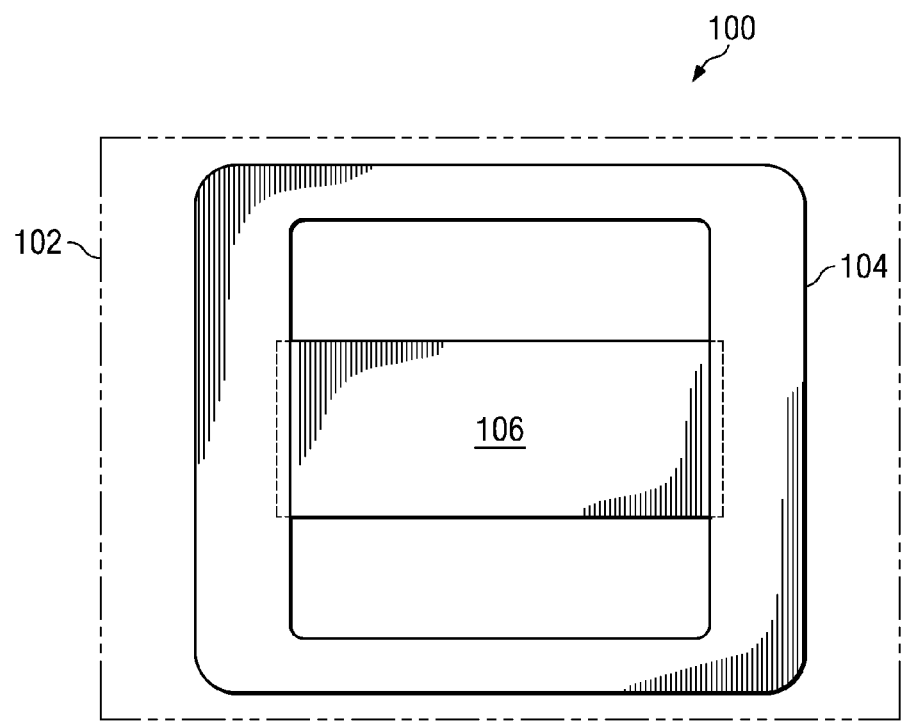
FIG. 2 illustrates a top view of the package in FIG. 1.

A top view of package 100 is illustrated in FIG. 2. It is noted that package substrate 102, or other portions of package 100, may have other features. For example, package substrate 102 may have alignment marks for aligning the device being packaged to the package frame during assembling. Alternatively, the package 100 may have alignment marks or reticles for aligning it to other members of a system employing the packaged device. For example, when the device being packaged is a spatial light modulator employed in a display system, the alignment marks or reticles can be used to align the package and the packaged spatial light modulator to optical elements of the display system. Such marks or recticles can be formed on a major surface of package substrate 102 or on a side-wall of the package substrate. Package substrate 102 may alternatively have anchoring mechanisms for anchoring the package substrate in systems employing the packaged device.

Depending upon the device to be packaged in the package, package 100 may have other functional features to improve the performance and/or lifetime of the devices in the package. For example, the package may include a getter and/or lubricant material when a MEMS device is to be packages. Such getter and/or lubricant materials can be disposed within the cavity of package substrate 102, or embedded in a side wall of the cavity.

The package as discussed above can be used for a variety of devices, including but not limited to integrated circuits and microstructures. Exemplary microstructures are MEMS devices, such as micromirror array devices (e.g. DMD), LCD devices, LCOS devices, micro-actuators (e.g. micro-motors), micro-sensors, micro-valves, micro-pumps, micro-filters, micro-probes, and micro-connectors. As an example, FIG. 3 illustrates a side view of a micromirror array device in a package using the package as described above.

Figure 3:
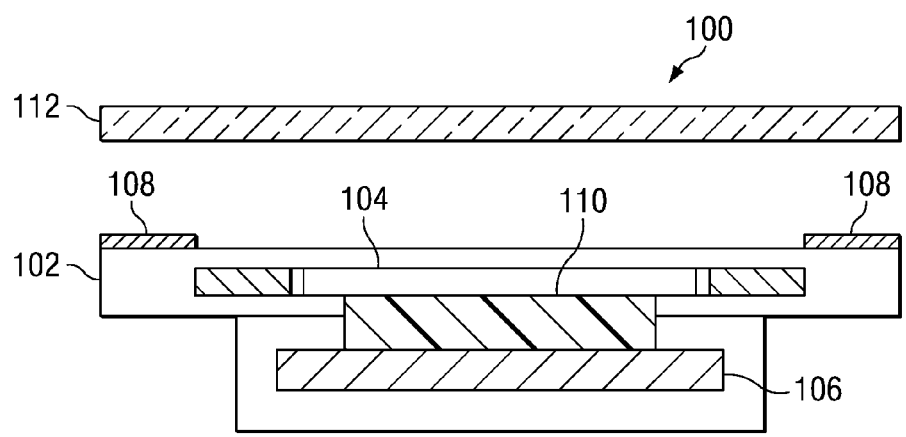
FIG. 3 illustrates a side view of an exemplary MEMS package using the package of FIG. 1.

Referring to FIG. 3, micromirror array device 110 is disposed on the top surface of the heat dissipater (e.g. heat dissipater 106 in FIG. 1). Though not required, a compliant thermo-conductive layer can be disposed between the heat dissipater and the micromirror array device. In this instance, the compliant thermo-conductive layer preferably has a CTE matching either the substrate of the micromirror array device or the heat dissipater or both. For fully enclosing the micromirror array device, package cover 112, which is preferably a visible light transmissive substrate (e.g. glass, quartz, or sapphire) or a non-transmissive substrate but with a light transmissive window, is bonded to the package substrate. The bonding can be hermetic or non-hermetic. The bonding uses a sealing material that can be inorganic materials, such as metals, metal alloys, metal compounds (e.g. a metal or metalloid oxide) or a glass frit. Exemplary sealing mediums comprise glass frit, such as Kyocera KC-700, $BiIn_x$, $AuSn_x$, Au, $BiSn_x$, $InAg_x$, $PbSn_x$, and copper. The sealing medium can comprise tin or lead. In addition, a glass frit, such as Kyocera KC-700 can also be used as the sealing medium.

In order to improve adhesion of solderable metallic materials to the bonding surface of the package when the bonding surface is composed of oxide materials, metallization layer 108 can be provided to the bonding area before applying the solderable metallic sealing materials. Exemplary metallization materials are aluminum, gold, nickel, or composition of two or more of suitable metallic elements, such as $AuNi_x$. These materials can be deposited on the surfaces as thick or thin films using suitable deposition methods, such as sputtering, printing or pasting. In an example, the metallization medium layer is a thin layer of noble metallic material, such as gold. This metallization medium layer is preferably sputtered as a film on the lower surface of the cover substrate. Alternatively, the metallization layer can be a multilayered structure, e.g. comprising metal-oxides (e.g. $CrO_2$ and $TiO_2$) and/or elemental metals (e.g. Cr, Au, Ni, and Ti).

When the metallization layer 108 comprises metal-oxide and metallic layers, the metal-oxide layer can be first deposited on the surface of the non-metallic substrate (such as the package surface), because it presents strong adhesion to the non-metallic surface, which is generally oxidized. The metallic layer is then attached to the metal-oxide layer. As another example, the metallization layer may comprise a $CrO_x$ layer followed by a Cr layer (or a Ti layer), followed by a Ni layer (or Pt layer) and then followed by an Au layer. The Ni layer may be deposited as a thick layer for improving the bond of the solder layer to the surface (or the cover substrate). However, a thick Ni layer may cause extra stress or distortion to the package system. To solve this problem, one or more Au layers can be inserted into the thick Ni layer, resulting in a laminated Ni—Au—Ni—Au structure. Also, the $CrO_2$ layer can be formed by forming a Cr layer followed by oxidation of the formed Cr layer, which can also be followed by the Ni (or Pt) layer.

In another example, light transmissive window 112 is composed of a light transmissive plastic material. Particularly, the light transmissive window 112 can be a plastic-framed window having a light transmissive portion. Such plastic-framed window can then be ultrasonically welded to the plastic package substrate. Of course, other types of light transmissive windows, and associated bonding methods for bonding the light transmissive window to the package substrate are also applicable.

Figure 4:
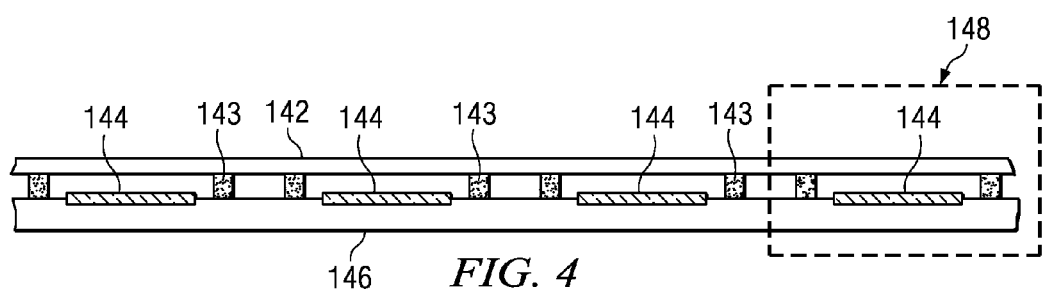
FIG. 4 schematically illustrates a cross-sectional view of a wafer level package.
Figure 5:
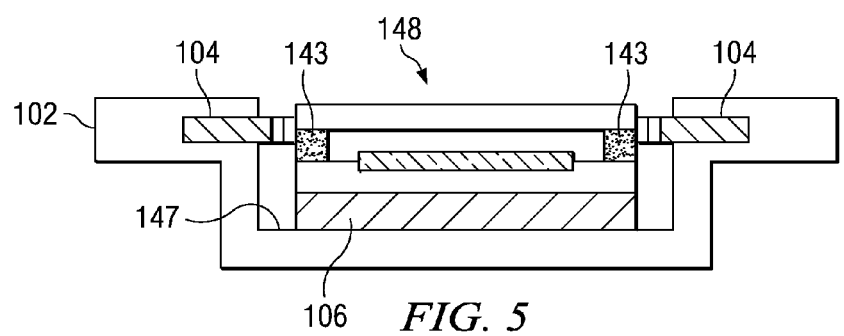
FIG. 5 schematically illustrates a singulated MEMS device disposed in the package.

Yet another example is schematically illustrated in FIG. 4 and FIG. 5. Referring to FIG. 4, a plurality of MEMS devices (e.g. micromirror array devices) can be formed on wafer level. For example when the MEMS devices are micromirror devices, functional members (e.g. 144), such as reflective and movable mirror plates, deformable hinges on which the mirror plates are attached, posts for holding the mirror plates and other desired features (e.g. mirror landing pads etc) of the micromirror array devices (e.g. micromirror device 148) are formed on wafer 146 that can be a semiconductor wafer (e.g. Si) or other suitable wafers (e.g. substrates that are transmissive to visible light). For protecting the functional members, wafer 142, which can be a substrate having a portion that is transmissive to the visible light or a light transmissive wafer (e.g. glass, quartz, and sapphire), is adhesively bonded to wafer 146 so as to enclose the functional members with spaces between wafers 142 and 146. The adhesive material can be any suitable bonding materials, such as eutectic materials, epoxy, SU-8, polyimide, and other suitable materials.

The bonded wafers can then be singulated so as to obtain individual devices, such as device 148. FIG. 5 schematically illustrates a cross-sectional view of a singulated device in the package shown in FIG. 1. Referring to FIG. 5, singulated MEMS device 148 is disposed on supporting surface 147 of the package. In this example, the light transmissive window (112) as discussed with referenced to FIG. 3 may not be necessary. Such packaged MEMS device can then be installed in an end application system, such as display systems herein the MEMS are spatial light modulators and gyroscopic systems wherein the MEMS are micro-accelerators. In an example wherein the MEMS device comprises an array of reflective and movable micromirror array, the packaged micromirror array device can be installed in a display system. The package eliminates potential mechanical damages to the packaged micromirror devices.

Figure 6:
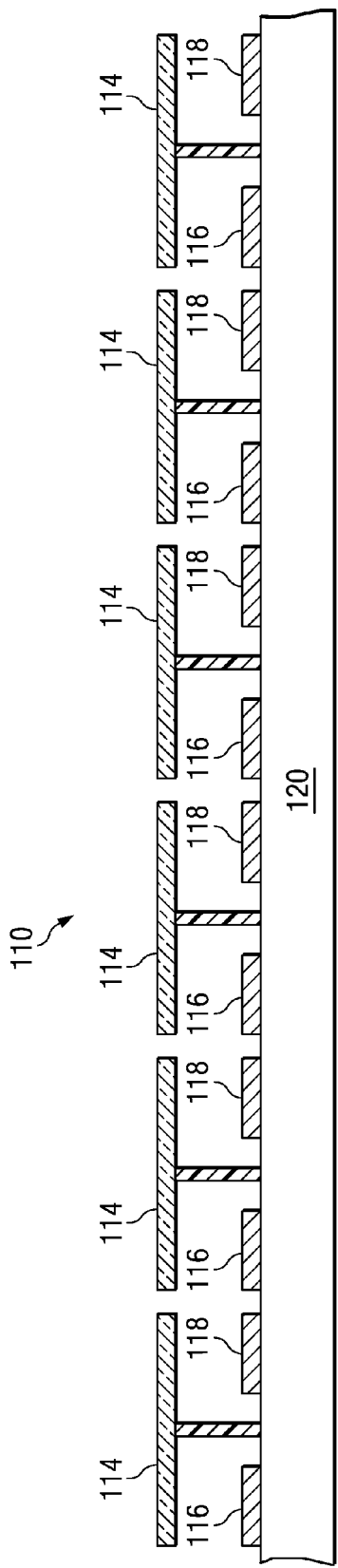
FIG. 6 illustrates a cross-sectional view of an exemplary MEMS device that can be packaged in the package shown in FIG. 3.

An exemplary micromirror array device in FIG. 3 is schematically illustrated in a cross-sectional view in FIG. 6. For simplicity purposes, only six micromirrors are shown. In practice, the micromirror array device may have any desired number of micromirrors. Referring to FIG. 6, micromirror array device 110 comprises an array of micromirrors each of which comprises a reflective mirror plate (e.g. mirror plate 114) held by a mechanically deformable hinge such that the mirror plate is capable of moving relative to substrate 120. The movement of the mirror plate can be accomplished by associating the mirror plate to one or more addressing electrodes (e.g. electrodes 116 and 118). By applying electronic voltages between the mirror plate and either addressing electrode, the mirror plate can be deflected, for example, to an ON and OFF angle. Electronic states of the addressing electrodes are controlled by electronic circuits formed on substrate 120 that can be a standard semiconductor substrate.

In an alternative example, the mirror plates can be formed on a substrate that does not have electrodes and circuits formed thereon. For example, the mirror plates can be formed on a second substrate, which is preferably a visible light transmissive substrate (e.g. glass, quartz, and sapphire). The second substrate can be bonded to the substrate having the electrodes and circuits. Alternatively, the mirror plates can be derived from a single crystal material.

Figure 7:
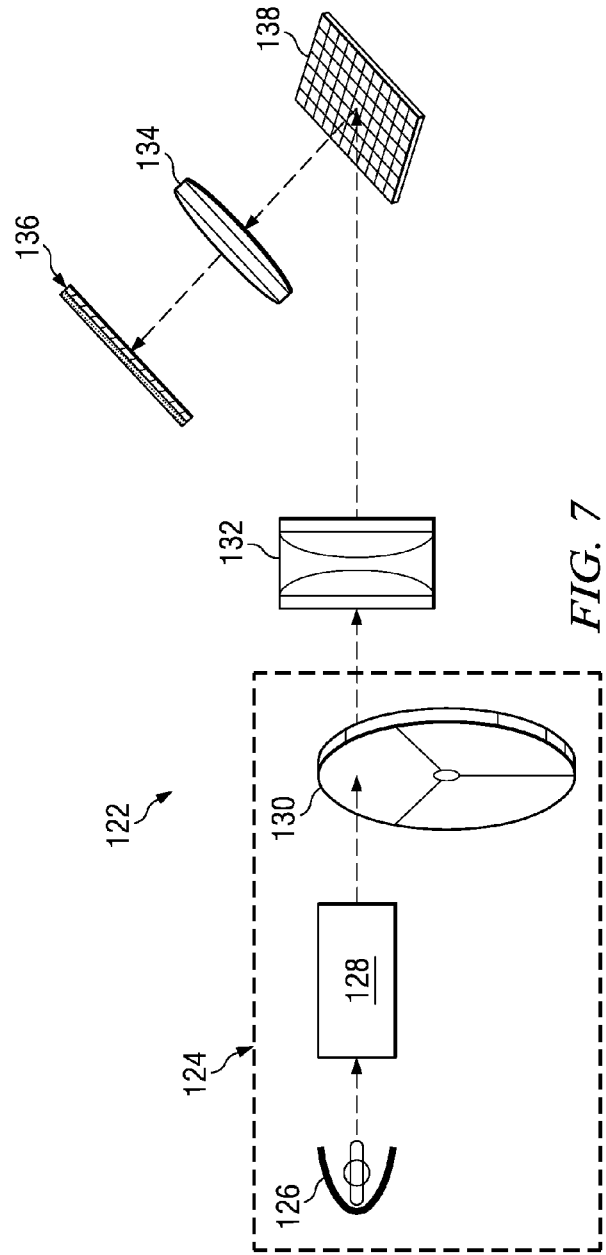
FIG. 7 is a diagram showing an exemplary display system employing a packaged MEMS device as shown in FIG. 3.

The micromirror array device package as shown in FIG. 3 can be used in many applications, one of which is display systems. FIG. 7 shows a diagram of an exemplary display system employing the micromirror array device package in FIG. 3. Referring to FIG. 7, display system 122 comprises illumination system 124, optical elements 132 and 134, spatial light modulator 138, and display target 136. The spatial light modulator comprises the micromirror array device package 110 as shown in FIG. 3.

The illumination system provides primary color light that is sequentially applied to the spatial light modulator. In an exemplary configuration, the illumination system comprises light source 126, which can be an arc lamp, LED(s) and laser(s), lightpipe 128 that can be any suitable integrator of light or light beam shape changer, and color filter 130, which can be a color wheel. In this particular configuration, the color wheel is positioned after the light source and lightpipe on the propagation path of the illumination light from the light source. Other optical configurations can also be used, such as placing the color wheel between the light source and the lightpipe. When the light source employs lasers or LEDs of different spectrums (e.g. Red, Green, and Blue, or Yellow, Cyan, and Magenta), the color filter may not be necessary. Optical element 132, which can be a condensing lens, directs the primary color light onto the spatial light modulator in which the primary color light is reflected either into or away from projection lens 134 so as to generate a desired image pattern in the display target. The set of primary colors can comprise any set of three or more colors used to render the output image.

It will be appreciated by those skilled in the art that a new and useful package has been described herein. In view of the many possible embodiments, however, it should be recognized that the embodiments described herein with respect to the drawing figures are meant to be illustrative only and should not be taken as limiting the scope of what is claimed. Those of skill in the art will recognize that the illustrated embodiments can be modified in arrangement and detail. In particular, other protective materials, such as inert gas, may be filled in the space formed by the package substrate and the cover substrate when the package cover is provided and bonded to the package substrate. Therefore, the devices and methods as described herein contemplate all such embodiments as may come within the scope of the following claims and equivalents thereof.

I claim:

1. A packaged device, comprising:
   a package substrate comprising a polymeric material;
   a metallic stiffener molded into the package substrate for improving stiffness of the package substrate;
   a microelectromechanical device disposed on the package substrate; and
   a heat dissipater disposed between the microelectromechanical device and a supporting surface of the package substrate.

2. The device of claim 1, wherein the heat dissipater comprises a metallic material that comprises Kovar.

3. The device of claim 1, wherein the polymeric material is an organic polymeric material.

4. The device of claim 1, wherein the stiffener is steel.

5. A packaged device, comprising:
   a package substrate comprising a polymeric material;
   a stiffener molded into the package substrate for improving stiffness of the package substrate; and
   a microelectromechanical device disposed on the package substrate, wherein the microelectromechanical device is a spatial light modulator device.

6. The device of claim 5, wherein the stiffener comprises a ceramic material.

7. The device of claim 5, wherein the microelectromechanical device is a micromirror device.

8. The device of claim 5, wherein the microelectromechanical device comprises:
a light transmissive substrate having a portion that is transmissive to visible light; and
a semiconductor substrate having a surface bonded to the light transmissive substrate and an opposing surface resting on a supporting surface of the package substrate.

9. The device of claim 5, wherein the package substrate comprises a heat dissipater embedded in the package substrate.

10. The device of claim 9, wherein the microelectromechanical device comprises:
a light transmissive substrate having a portion that is transmissive to visible light; and
a semiconductor substrate having a surface bonded to the light transmissive substrate and an opposing surface resting on a supporting surface of the heat dissipater.

11. A packaged device, comprising:
a package substrate comprising a polymeric material;
a stiffener molded into the package substrate for improving stiffness of the package substrate;
a microelectromechanical device disposed on the package substrate; and
a heat dissipater disposed between the microelectromechanical device and a supporting surface of the package substrate wherein the heat dissipater comprises a metallic material that comprises Kovar.

12. The device of claim 11, wherein the polymeric material is an organic polymeric material.

13. The device of claim 11, wherein the stiffener comprises a metallic material.

14. The device of claim 13, wherein the metallic material comprises steel.

15. The device of claim 11, wherein the stiffener comprises a ceramic material.

16. A packaged device, comprising:
a package substrate comprising a polymeric material;
a stiffener molded into the package substrate for improving stiffness of the package substrate;
a micromirror device disposed on the package substrate; and
a heat dissipater disposed between the micromirror device and a supporting surface of the package substrate wherein the heat dissipater comprises a metallic material that comprises Kovar.

* * * * *